United States Patent
Ahn et al.

(10) Patent No.: US 11,127,456 B2
(45) Date of Patent: Sep. 21, 2021

(54) NONVOLATILE MEMORY DEVICE AND METHOD OF PROGRAMING WITH CAPABILITY OF DETECTING SUDDEN POWER OFF

(71) Applicant: Samsung Electronics Co., Ltd., Suwon-si (KR)

(72) Inventors: Ho-Sung Ahn, Gwangmyeong-si (KR); Youn-Soo Cheon, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/746,413

(22) Filed: Jan. 17, 2020

(65) Prior Publication Data
US 2020/0395066 A1 Dec. 17, 2020

(30) Foreign Application Priority Data
Jun. 13, 2019 (KR) .................. 10-2019-0070018

(51) Int. Cl.
| | |
|---|---|
| G11C 11/56 | (2006.01) |
| G11C 16/04 | (2006.01) |
| G06F 3/06 | (2006.01) |
| G11C 16/14 | (2006.01) |
| G11C 16/30 | (2006.01) |
| G11C 16/10 | (2006.01) |

(52) U.S. Cl.
CPC ........ *G11C 11/5628* (2013.01); *G06F 3/0604* (2013.01); *G06F 3/0659* (2013.01); *G06F 3/0673* (2013.01); *G11C 11/5635* (2013.01); *G11C 11/5671* (2013.01); *G11C 16/0483* (2013.01); *G11C 16/10* (2013.01); *G11C 16/14* (2013.01); *G11C 16/30* (2013.01)

(58) Field of Classification Search
CPC ............ G11C 11/5628; G11C 11/5671; G11C 11/5635; G11C 16/0483; G11C 16/14; G11C 16/30; G11C 16/10; G06F 3/0673; G06F 3/0604; G06F 3/0659
See application file for complete search history.

(56) References Cited

U.S. PATENT DOCUMENTS

| | | | |
|---|---|---|---|
| 9,239,782 | B2 | 1/2016 | Yang |
| 9,563,249 | B2 | 2/2017 | Lin |
| 9,728,278 | B2 | 8/2017 | Muchherla et al. |
| 9,921,898 | B1 | 3/2018 | Miller et al. |
| 10,007,451 | B2 | 6/2018 | Zhang et al. |
| 10,049,754 | B1 | 8/2018 | Jung |
| 10,248,503 | B2 | 4/2019 | Hong |
| 10,847,229 | B2 * | 11/2020 | Jo ....................... G11C 11/5642 |

(Continued)

*Primary Examiner* — Sultana Begum
(74) *Attorney, Agent, or Firm* — Muir Patent Law, PLLC

(57) ABSTRACT

Provided herein are a nonvolatile memory device and a method of programming the same. The nonvolatile memory device includes a memory cell array including a plurality of word lines having a first word line and a plurality of memory cells connected to the first word line. The plurality of memory cells includes a plurality of monitoring cells and a plurality of data cells each data cell configured to store N-bit data, N being a natural number. The nonvolatile memory device is configured to perform a first program on the plurality of data cells and a detection program different from the first program on the one or more monitoring cells after performing the first program.

16 Claims, 21 Drawing Sheets

(56) References Cited

U.S. PATENT DOCUMENTS

| | | | |
|---|---|---|---|
| 2010/0165719 A1* | 7/2010 | Pellizzer | G11C 13/0069 |
| | | | 365/163 |
| 2013/0128663 A1* | 5/2013 | Kim | G11C 11/5628 |
| | | | 365/185.03 |
| 2018/0107412 A1 | 4/2018 | Jun | |
| 2019/0259457 A1* | 8/2019 | Jun | G11C 16/10 |
| 2020/0073753 A1* | 3/2020 | Kim | G06F 3/0619 |

\* cited by examiner

NONVOLATILE MEMORY DEVICE AND METHOD OF PROGRAMING WITH CAPABILITY OF DETECTING SUDDEN POWER OFF

This application claims priority under 35 U.S.C. § 119 to Korean Patent Application No. 10-2019-0070018 filed on Jun. 13, 2019 in the Korean Intellectual Property Office, and all the benefits accruing therefrom under 35 U.S.C. 119, the contents of which in its entirety are herein incorporated by reference.

BACKGROUND

1. Field of the Disclosure

The present disclosure relates to a nonvolatile memory device and a method of programming the same.

2. Description of the Related Art

Nonvolatile memory devices are memory devices in which stored data is not erased even when a supply of power is interrupted. Examples of the nonvolatile memory devices include programmable read only memories (PROMs), erasable programmable PROMs (EPROMs), electrically EPROMs (EEPROMs), flash memory devices, and the like. Among the nonvolatile memory devices, the flash memory devices may be constituted of various types of memory cells and may be broadly classified into NAND-type flash memory devices and NOR-type flash memory devices according to a cell array structure.

Meanwhile, while data is programmed to a memory cell of a nonvolatile memory device, a sudden power off may occur in the nonvolatile memory device. When the power off occurs during the program operation, reliability of the data programmed to the memory cell cannot be ensured. Therefore, various methods which are capable of determining whether a sudden power off occurs during data being programmed to a memory cell are being studied.

SUMMARY

Aspects of the present disclosure provide a nonvolatile memory device which is capable of detecting whether a sudden power off occurs while data is programmed to a memory cell while minimizing an influence on performance of the nonvolatile memory device.

Aspects of the present disclosure also provide a nonvolatile memory device which is capable of detecting whether a sudden power off occurs while data is programmed to a memory cell while minimizing an influence on performance of the nonvolatile memory device.

According to an aspect of the present inventive concept, there is provided a nonvolatile memory device comprising, a memory cell array including a plurality of word lines having a first word line and a plurality of memory cells connected to the first word line, wherein the plurality of memory cells includes one or more monitoring cells and a plurality of data cells each data cell configured to store N-bit data, N being a natural number. The nonvolatile memory device is configured to perform a first program on the plurality of data cells and to perform a detection program different from the first program on the one or more monitoring cells. The detection program may be performed after performing the first program.

According to an aspect of the present inventive concept, there is provided a storage device comprising, a nonvolatile memory including a plurality of word lines having a first word line and a plurality of memory cells connected to the first word line, wherein the plurality of memory cells includes a plurality of monitoring cells and a plurality of data cells each data cell configured to store N-bit data, N being a natural number; and a controller configured to perform a first program on the plurality of data cells and to perform a detection program different from the first program on the plurality of monitoring cells, wherein the controller includes a sudden power off (SPO) detector, and the SPO detector is configured to detect whether an SPO occurs while the first program is performed on the plurality of data cells.

According to an aspect of the present inventive concept, there is provided a nonvolatile memory device comprising, a memory cell array including a plurality of word lines including a first word line and a plurality of first memory cells and a plurality of second memory cells both connected to the first word line. The nonvolatile memory device is configured to perform a first program on the plurality of first memory cells each cell of the plurality of first memory cells configured to store N-bit data, N being a natural number, and to perform a detection program different from the first program on the plurality of second memory cells as a plurality of monitoring cells. Technical aspects of the present disclosure are not limited to the above-described technical aspects, and other technical aspects of the present disclosure not mentioned above should be clearly understood by those skilled in the art from the following description.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings.

DETAILED DESCRIPTION OF THE EMBODIMENTS

Figure 1A:
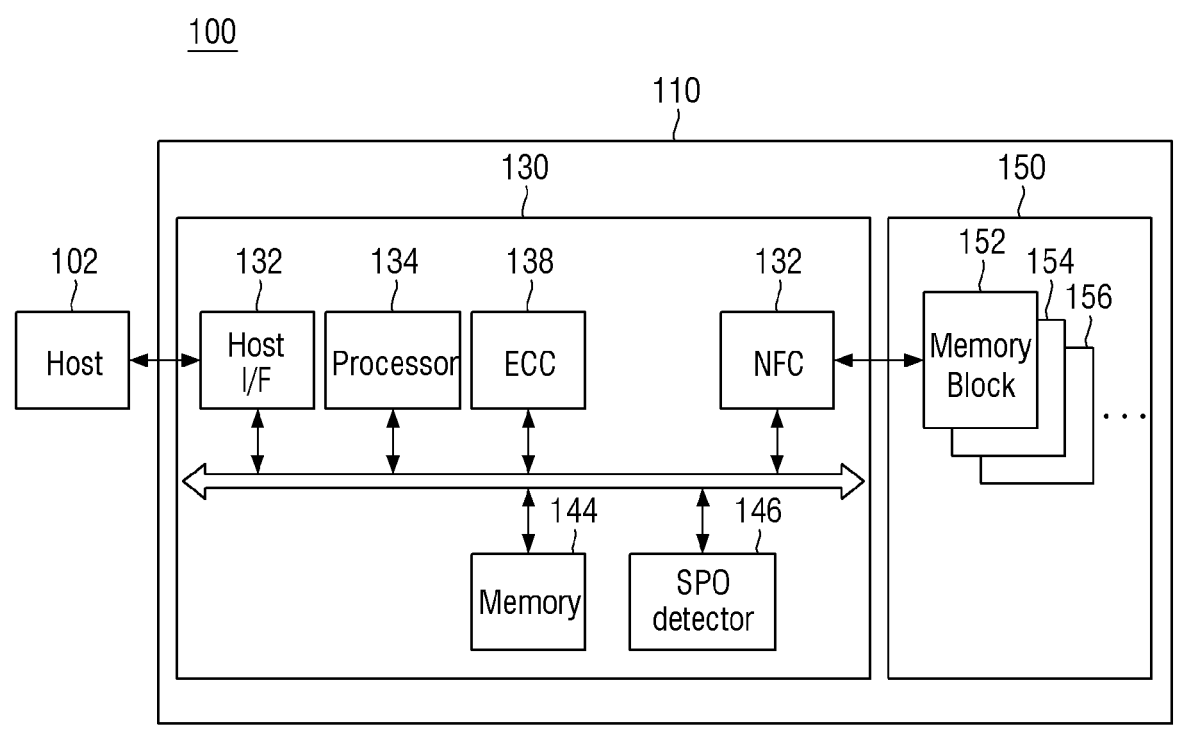
FIGS. 1A and 1B are exemplary block diagrams for describing a data processing system including a nonvolatile memory device according to some embodiments of the present disclosure.
Figure 1B:
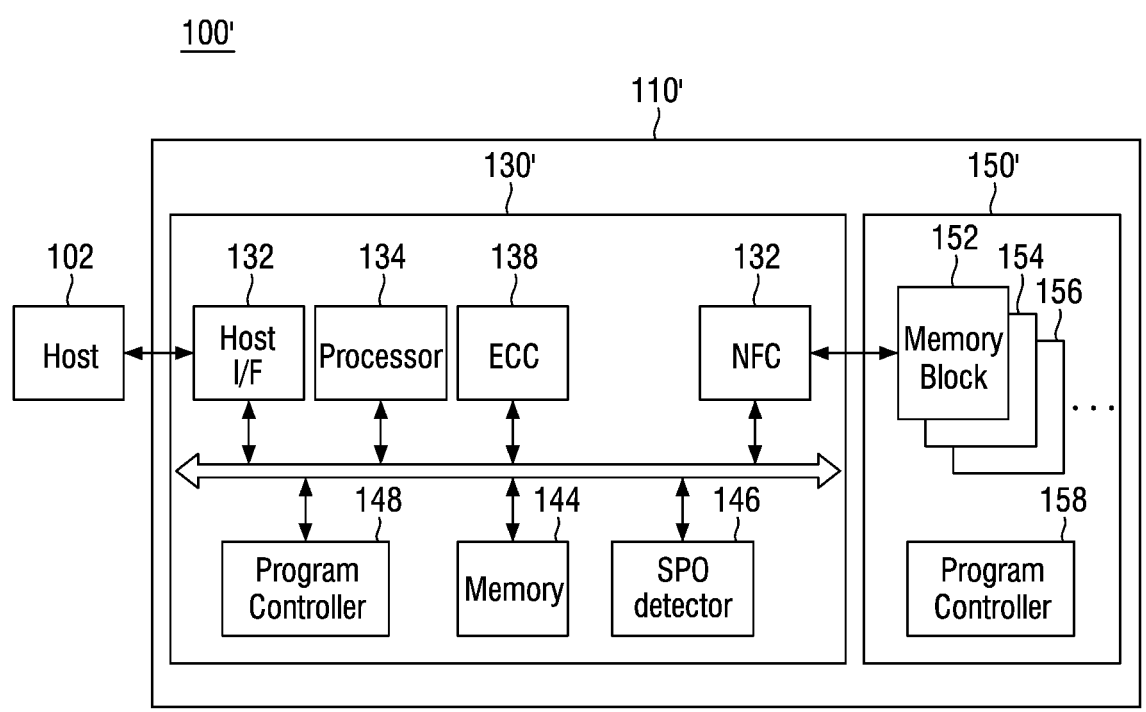

FIGS. 1A and 1B are exemplary block diagram for describing a data processing system including a nonvolatile memory device according to some embodiments of the present disclosure.

Referring to FIG. 1A, a data processing system 100 includes a host 102 and a memory system 110.

The host 102 may include electronic devices, for example, portable electronic devices such as mobile phones, motion picture experts group (MPEG) layer-3 (MP3) players, laptop computers, and the like, or wired and wireless electronic devices such as desktop computers, game machines, televisions (TVs), projectors, and the like, but the present disclosure is not limited thereto.

Further, the host 102 may include at least one operating system (OS). The OS may generally manage and control functions and operations of the host 102 and provide an interface between the host 102 and a user using the data processing system 100 or the memory system 110. Here, the OS may support functions and operations corresponding to the purpose and use of the user. For example, the OS may be classified into a general OS and a mobile OS according to mobility of the host 102. Further, in the OS, the general OS may be classified into a personal OS and a business OS according to a use environment of the user. For example, the personal OS may be a system characterized by supporting service provisioning functions for a general user and may include Windows, Chrome, or the like. Further, for example, the business OS may be a system characterized by securing and supporting high performance and may include Windows servers, Linux, Unix, or the like. In this case, the host 102 may include a plurality of OSs. Further, in order to perform an operation with the memory system 110 corresponding to a user's request, the host 102 may execute an OS.

Further, the memory system 110 operates in response to a request from the host 102 and stores data which is accessed by the host 102. For example, the memory system 110 may be used as a main memory device or an auxiliary memory device of the host 102. Here, the memory system 110 may be implemented with any one among various types of storage devices according to a host interface protocol connected to the host 102. For example, the memory system 110 may be implemented with any one among a solid state drive (SSD), a multi-media card (MMC), an embedded MMC (eMMC), a secure digital (SD) card in the form of a mini-SD or a micro SD, and the like, but the present disclosure is not limited thereto.

Further, the storage devices implementing the memory system 110 may be implemented with volatile memory devices such as a dynamic random access memory (DRAM), a static RAM (SRAM), and the like, and nonvolatile memory devices such as a read only memory (ROM), a mask ROM (MROM), a programmable ROM (PROM), an erasable ROM (EPROM), an electrically EPROM (EEPROM), a ferromagnetic RAM (FeRAM), a phase change RAM (PRAM), a magnetic RAM (MRAM), a resistive RAM (RRAM), a flash memory, and the like.

Further, the memory system 110 may include a nonvolatile memory device 150, which is capable of storing data accessed by the host 102, and a controller 130 which is capable of controlling data to be stored in the nonvolatile memory device 150.

Here, the controller 130 and the nonvolatile memory device 150 may be integrated into a single semiconductor device. For example, the controller 130 and the nonvolatile memory device 150 may be integrated into a single semiconductor device to form an SSD. When the memory system 110 is used as an SSD, an operating speed of the host 102 connected to the memory system 110 may be further improved. Further, the controller 130 and the nonvolatile memory device 150 may be integrated into a single semiconductor device to form a memory card, e.g., a personal computer memory card international association (PCMCIA) card, a compact flash (CF) card, a universal flash storage (UFS), or the like, but the present disclosure is not limited thereto.

Further, for example, the memory system 110 may be constituted of a computer, an ultra mobile PC (UMPC), a workstation, a digital picture player, a digital video recorder, a digital video player, a storage constituting a data center, a device which is capable of transmitting and receiving information in a wireless environment, one among various electronic devices constituting a home network, one of various electronic devices constituting a computer network, one of various electronic devices constituting a telematics network, a radio frequency identification (RFID) device, one among various components constituting a computing system, or the like, but the present disclosure is not limited thereto.

The nonvolatile memory device 150 may hold stored data even when power is not supplied. In particular, the nonvolatile memory device 150 performs a write operation to store data provided from the host 102 and performs a read operation to provide the stored data to the host 102. Here, the nonvolatile memory device 150 may include a plurality of memory blocks 152, 154, and 156. Each of the plurality of memory blocks 152, 154, and 156 may include a plurality of pages. Each of the plurality of pages may include a plurality of memory cells connected to a plurality of word lines WL. In some examples, each of the plurality of pages may include a plurality of memory cells connected to a word line WL. Further, the nonvolatile memory device 150 may include a plurality of planes each having the plurality of memory blocks 152, 154, and 156. In particular, the nonvolatile memory device 150 may include a plurality of memory dies each having the plurality of planes. Further, the nonvolatile memory device 150 may be a flash memory. In this case, the flash memory may have a three-dimensional stack structure.

The controller 130 in the memory system 110 may control the nonvolatile memory device 150 in response to a request from the host 102. For example, the controller 130 may provide the host 102 with data, which is read from the nonvolatile memory device 150, and store data provided from the host 102 in the nonvolatile memory device 150. To this end, the controller 130 may control a read operation, a write operation, a program operation, and an erase operation, and the like of the nonvolatile memory device 150. More specifically, the controller 130 may include a host interface (I/F) unit 132, a processor 134, an error correction code (ECC) unit 138, a power management unit (PMU) 140, a NAND flash controller (NFC) 142, a memory 144, and a sudden power off (SPO) detector 146. An internal configuration of the controller 130 is not limited thereto.

The host I/F unit 132 is configured to process a command and data of the host 102 and communicate with the host 102 through at least one among various interface protocols such as a Universal Serial Bus (USB), integrated drive electronics (IDE), a mobile industry processor interface (MIPI), and the like, but the present disclosure is not limited thereto.

When data stored in the nonvolatile memory device 150 is read, the ECC unit 138 may detect and correct an error included in the data which is read from the nonvolatile memory device 150. For example, the ECC unit 138 may perform error correction decoding on the data which is read from the nonvolatile memory device 150, determine whether the error correction decoding is successfully performed, output an instruction signal, e.g., an error correction success or fail signal, according to the determination result, and correct an error bit of the read data using a parity bit generated during an ECC encoding process. In this case, when the number of error bits occurs greater than a correctable error bit limit, the ECC unit 138 cannot correct the error bits and may output an error correction fail signal corresponding to the fact that the error bits cannot be corrected.

The ECC unit 138 may perform error correction using a coded modulation including a low density parity check (LDPC) code, a Bose-Chaudhuri-Hocquenghem (BCH) code, a turbo code, a Reed-Solomon code, a convolution code, or the like, but the present disclosure is not limited thereto. Further, the ECC unit 138 may include all of circuits, modules, systems, or devices for error correction.

The PMU 140 may provide and manage power of the controller 130, i.e., power of components included in the controller 130.

The NFC 142 is a memory/storage interface which interfaces between the controller 130 and the nonvolatile memory device 150 so as to allow the controller 130 to control the nonvolatile memory device 150 in response to a request from the host 102. The NFC 142 may generate a control signal for the nonvolatile memory device 150 and process data under the control of the processor 134. Here, the NFC 142 may perform an operation of an interface which processes a command and data between the controller 130 and the nonvolatile memory device 150. In particular, the NFC 142 may support data input and output between the controller 130 and the nonvolatile memory device 150.

The memory 144 may be an operation memory of the memory system 110 and the controller 130 and may store data for driving the memory system 110 and the controller 130. More specifically, the memory 144 may allow the controller 130 to control the nonvolatile memory device 150 in response to a request from the host 102. For example, the controller 130 may provide the host 102 with data, which is read from the nonvolatile memory device 150, and store data, which is provided from the host 102, in the nonvolatile memory device 150. To this end, the controller 130 may control a read operation, a write operation, a program operation, an erase operation, and the like of the nonvolatile memory device 150.

The memory 144 may be implemented with a volatile memory, e.g., an SRAM, a DRAM, or the like. Further, as shown in FIG. 1A, the memory 144 may be present inside or outside the controller 130. In this case, the memory 144 may be implemented as an external volatile memory through which data is input and output from the controller 130 through a memory interface.

As described above, the memory 144 may store data required for performing a data write operation and a data read operation between the host 102 and the nonvolatile memory device 150 and data generated when the data write operation and the data read operation are performed. In order to store the pieces of data, the memory 144 may include at least one of a program memory, a data memory, a write buffer cache, a read buffer cache, a data buffer cache, and a map buffer cache.

In some embodiments, the sudden power off (SPO) detector 146 may detect whether an SPO occurs in the nonvolatile memory device 150. When the SPO occurs in the nonvolatile memory device 150, since an error occurs in the data stored in the nonvolatile memory device 150, it is necessary to accurately detect occurrence of the SPO and remove a corresponding data.

For example, an example of a multi-level cell (MLC) method, which is one among methods of increasing a memory capacity of the nonvolatile memory device 150, will be described. The MLC method is a method of storing a plurality of bits in a single memory cell. However, programming according to the MLC method may cause an error that is occurred from which lower bit data having been written in a memory cell is mixed with higher bit data being input to the memory cell and thus the lower bit data is lost. For example, when an SPO occurs while higher bit data is programmed, there may occur a problem in that lower bit data having been written in a memory cell is influenced by higher bit data being input to the memory cell such that a value of the lower bit data may be changed.

Thus, it is possible for the SPO detector 146 to accurately determine whether an SPO is generated in a memory cell while minimizing an influence on performance of the nonvolatile memory device 150, thereby deleting data of the memory cell in which an error occurs due to occurrence of the SPO. An operation of the SPO detector 146 will be described in detail below with reference to the drawings.

Referring to FIG. 1B, a data processing system 100' includes a host 102 and a memory system 110'. The memory system 110' may include a controller 130' and a nonvolatile memory device 150'. The memory system 110' of FIG. 1B may have substantially the same configuration as that of the memory system 110 of FIG. 1A. Therefore, the same operations and structures as explained in FIG. 1A will be omitted to avoid duplicate explanations.

The controller 130' may further include a program controller 148 controlling programming of the nonvolatile memory device 150' according to a program sequence according to a programming method of the present disclosure.

Figure 2A:
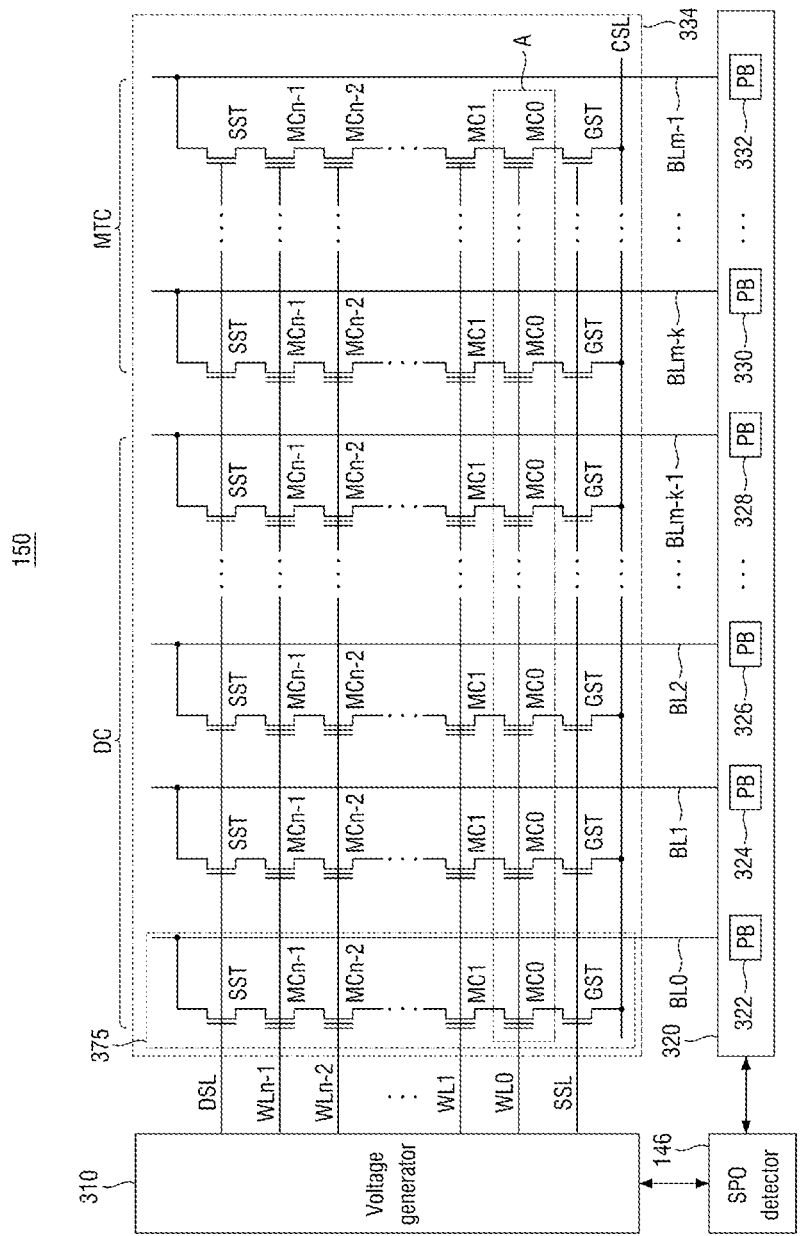
FIGS. 2A and 2B are exemplary diagrams for describing a nonvolatile memory device according to some embodiments of the present disclosure.
Figure 2B:
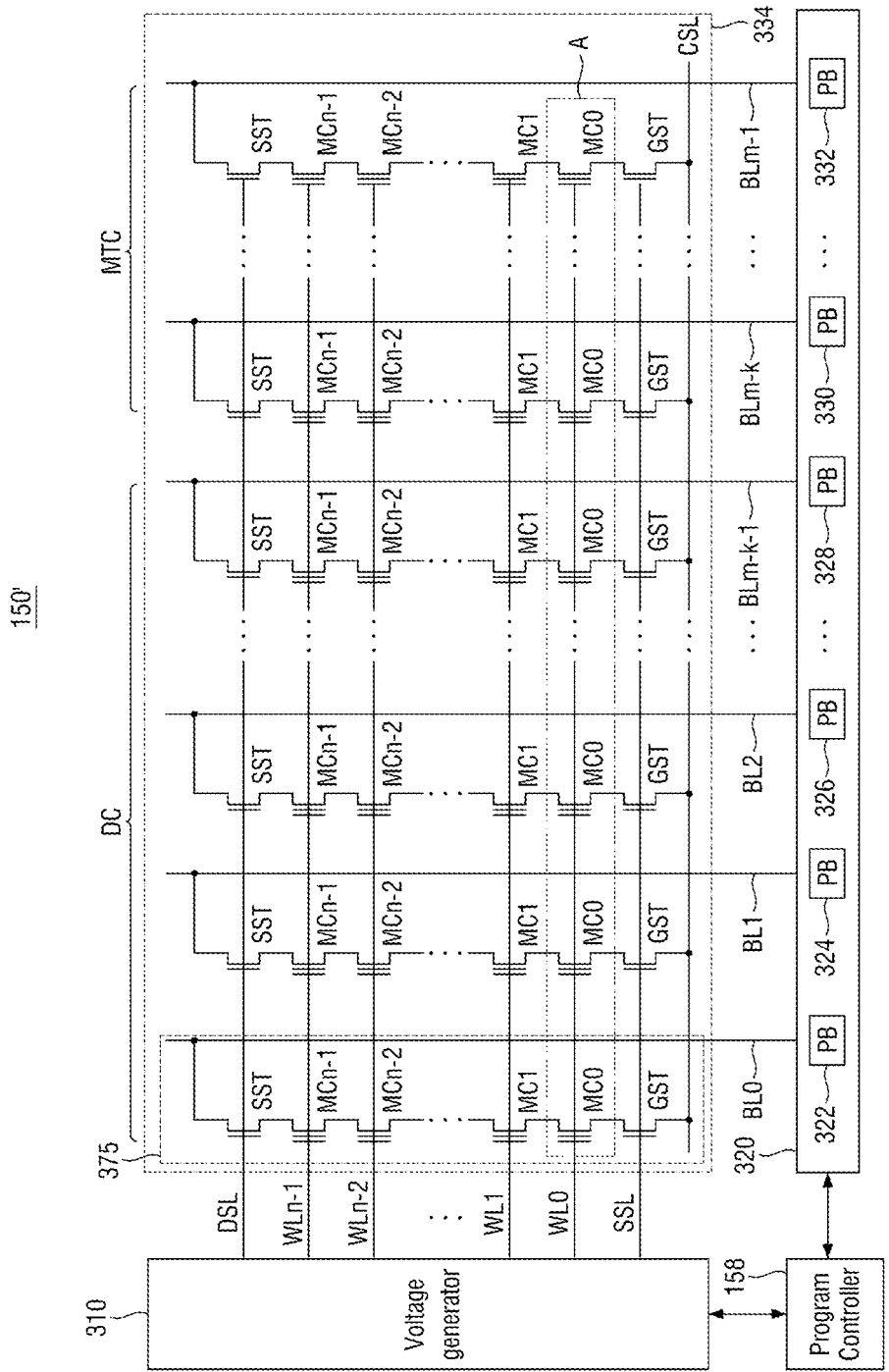

FIGS. 2A and 2B are exemplary diagrams for describing a nonvolatile memory device according to some embodiments of the present disclosure.

Referring to FIG. 2A, a memory block 334 among the plurality of memory blocks of the nonvolatile memory device 150 may be implemented as a memory cell array to include a plurality of cell strings 375 connected to a plurality of bit lines BL0 to BLm−1. Each of the cell strings 375 arrayed in columns may include at least one ground select transistor (GST) and at least one string select transistor (SST). A plurality of memory cells MC0 to MCn−1 may be connected in series between the GST and the SST.

The SST may be electrically connected to a drain select line DSL and turned on or off in response to an electrical signal through the DSL. The GST may be electrically connected to a source select line SSL and turned on or off in response to an electrical signal through the SSL. The DSL and the SSL may be controlled by a voltage generator 310.

Each of the plurality of memory cells MC0 to MCn−1 may be constituted of a single level cell SLC which stores one-bit data information per cell or may be constituted of an MLC, a triple level cell TLC, or a quad level cell QLC which stores plural-bits of data information per cell, but the present disclosure is not limited thereto. Each of the cell strings 375 may be electrically connected to a corresponding one among the plurality of bit lines BL0 to BLm−1.

Among the plurality of bit lines BL0 to BLm−1, even bit lines (e.g., BL0, BL2, BL4, . . . ) are connected to each other and odd bit lines (e.g., BL1 and BL3, BL5, . . . ) are connected to each other such that only the even bit lines or only the odd bit lines may be programmed. For convenience of description, a description will be made below in which the bit lines are not divided into even bit lines and odd bit lines.

Although FIG. 2A illustrates the memory block 334, which is constituted of a NAND flash memory, as one among some embodiments, in addition to the NAND flash memory, the memory block 334 may be implemented with a NOR-type flash memory, a hybrid flash memory in which two or more types of memory cell are mixed, a one-NAND flash memory in which a controller is embedded in a memory chip, and the like. Further, the nonvolatile memory device 150 according to some embodiments may be implemented with not only a flash memory device in which a charge storage layer is constituted of a conductive floating gate, but also a charge trap flash (CTF) memory device in which a charge storage layer is constituted of an insulating film, and the like.

According to an operating mode, the voltage generator 310 of the nonvolatile memory device 150 may provide a word line voltage (e.g., a program voltage, a read voltage, a pass voltage, or the like) which will be supplied to each of word lines WL0 to WLn−1, and a voltage which will be supplied to a bulk (e.g., a well region) in which the plurality of memory cells MC0 to MCn−1 are formed. For example, a voltage of the voltage generator 310 may be generated under the control of the controller 130 of FIG. 1A. In particular, the SPO detector 146 in the controller 130 of FIG. 1A may control the voltage generator 310 to detect whether an SPO occurs in the plurality of word lines WL0 to WLn−1 connected to the voltage generator 310. Further, in order to generate pieces of read data, the voltage generator 310 may generate a plurality of variable read voltages and select one among the plurality of word lines WL0 to WLn−1.

Further, the nonvolatile memory device 150 may be controlled by a read/write circuit 320. The read/write circuit 320 may operate as a sense amplifier or a write driver according to an operating mode. For example, in the case of a verification operation or a normal read operation, the read/write circuit 320 may operate as a sense amplifier for reading data from the memory cell array. Further, in the case of a program operation, the read/write circuit 320 may operate as a write driver for driving the plurality of bit lines BL0 to BLm−1 according to data which will be stored in the memory cell array. During the program operation, the read/write circuit 320 may receive data, which will be written to the memory cell array, from a buffer (not shown) and drive the plurality of bit lines BL0 to BLm−1 according to input data. To this end, the read/write circuit 320 may include a plurality of page buffers 322, 324, 326, 328, 330, and 332 corresponding to columns (or the bit lines) or column pairs (or bit line pairs). The plurality of page buffers 322, 324, 326, 328, 330, and 332 may include a plurality of latches. The number of the page buffers 322, 324, 326, 328, 330, and 332 may be equal to the number of the plurality of bit lines BL0 to BLm−1. The number of the bit lines BL0 to BLm−1 and the number of the page buffers 322, 324, 326, 328, 330, and 332 are not limited thereto.

The plurality of memory cells MC0 to MCn−1 may be defined at positions at which the plurality of word lines WL0 to WLn−1 intersect the plurality of bit lines BL0 to BLm−1 in the memory cell array of the nonvolatile memory device 150. According to some embodiments, each cell of the plurality of memory cells MC0 to MCn−1 may store P-bit data (here P is a natural number).

In example embodiments, some among the plurality of memory cells MC0 to MCn−1 sharing the plurality of word lines WL0 to WLn−1 may be defined as a plurality of data cells DC which each store P-bit data, and the remaining cells thereamong may be defined as a plurality of monitoring cells MTC which detect whether an SPO occurs in each of the plurality of word lines WL0 to WLn−1 connected to the plurality of data cells DC. For example, the plurality of data cells DC and the plurality of monitoring cells MTC may share the plurality of word lines WL0 to WLn−1. In this case, the plurality of monitoring cells MTC may be defined as additional memory cells or spare memory cells of the nonvolatile memory device 150.

In the nonvolatile memory device 150 according to some embodiments, the memory cell array of the NAND-type flash memory has been illustrated in FIG. 2A, but the present disclosure is not limited to that shown in FIG. 2A. Unlike FIG. 2A, the nonvolatile memory device 150 according to some embodiments may be a NOR-type flash memory, a phase change memory PRAM, or a resistive memory RRAM.

Referring to FIG. 2B, the nonvolatile memory device 150' of FIG. 2B may have substantially the same configuration as that of the nonvolatile memory device 150 of FIG. 2A. Therefore, the same operations and structures as explained in FIG. 2A will be omitted to avoid duplicate explanations.

In some embodiments, the nonvolatile memory device 150' may further include a program controller 158 controlling programming of the memory block 334 according to a program sequence according to a programming method of the present disclosure.

In some embodiments, a voltage generator 310 may generate various types of voltages used to perform a program operation, a read operation, and an erase operation on the of the memory block 334 based on a voltage control signal CTRL (not shown). A control logic (not shown) of the nonvolatile memory device 150' may output various control signals used to write data to the memory block 334 or read data from the memory block 334 based on a command CMD, an address ADDR, and a control signal CTRL received from the memory controller 130'. Accordingly, the control logic may control various operations in the nonvolatile memory device 150' overall.

The program controller 158 may control a program operation of the nonvolatile memory device 150'. In some embodiments, the program controller 158 may set voltage levels of a plurality of driving voltage respectively corresponding to a plurality of program states. A plurality of driving voltages may include program voltages respectively corresponding to a plurality of program states, verification voltages, offset voltages, and compensation voltages according to a program speed of a word line. In addition, the program controller 158 may set a voltage level of a program voltage set corresponding to respective program states.

According to some embodiments, some of functions of the program controller 158 may be performed in the controller 130' by the program controller 148 included in the controller 130'.

Figure 3:
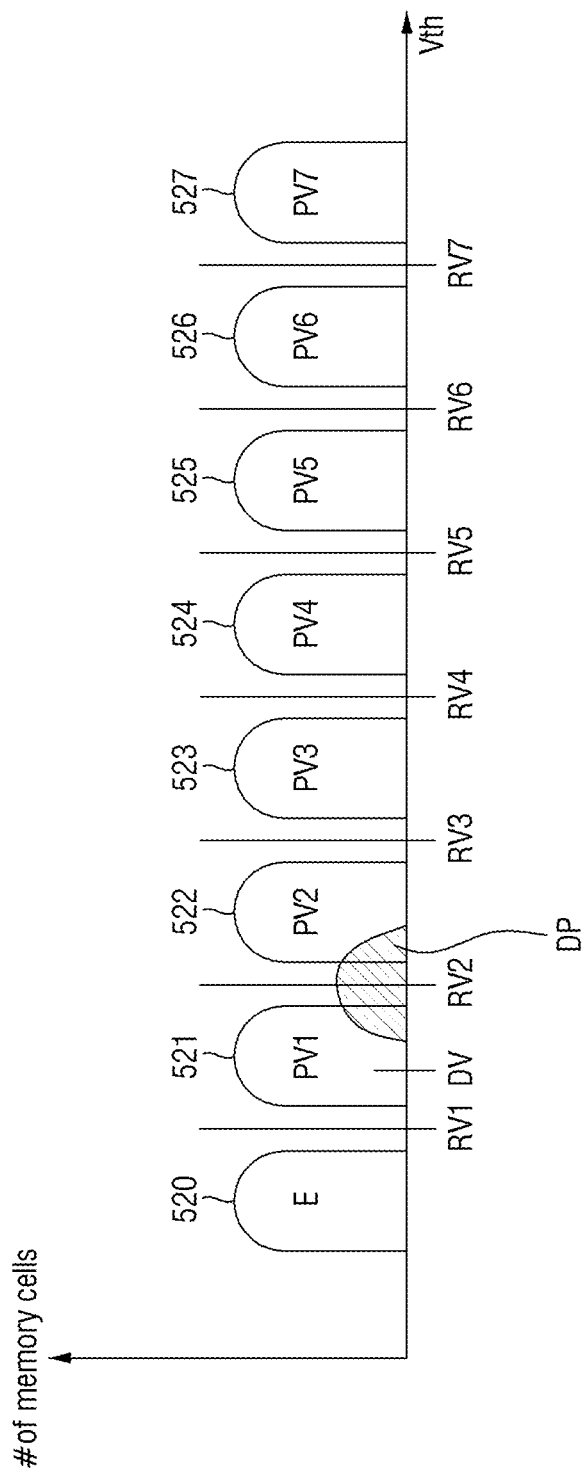
FIG. 3 shows graphs of threshold voltage dispersions when a detection program is performed on a nonvolatile memory device according to some embodiments of the present disclosure.

FIG. 3 shows graphs of threshold voltage dispersions when a detection program is performed on a nonvolatile memory device according to some embodiments of the present disclosure.

Referring to FIGS. 2A, 2B and 3, the SPO detector 146, the program controller 148, or the program controller 158 may apply a pulse of a detection program DP to the plurality of monitoring cells MTC. Specifically, the pulse of the detection program is applied to a word line connected to the plurality of monitoring cells MTC during the detection program. In some embodiments, the pulse of the detection program DP may be applied to the plurality of monitoring cells MTC only once. For example, the pulse of the detection program DP may be one single pulse.

For example, according to the graph of FIG. 3, in an MLC, a plurality of data cells DC of some among the plurality of word lines by which a program operation is completed in the nonvolatile memory device 150 (Hereinafter, or the nonvolatile memory device 150') may be programmed in an erase state E and any one among program states PV1 to PV7.

Some among the plurality of data cells DC of which threshold voltages are less than a first read voltage RV1 may be evaluated as the erase state E, and some others among the plurality of data cells DC of which threshold voltages exceed the first read voltage RV1 and are less than a second read voltage RV2 may be evaluated as a first program state PV1. Some others among the plurality of data cells DC of which threshold voltages exceed the second read voltage RV2 and are less than a third read voltage RV3 may be evaluated as a second program state PV2. Similarly, the remaining cells among the plurality of data cells DC may be evaluated as a third program state PV3 to a seventh program state PV7 by a third lead voltage RV3 to a seventh read voltage RV7.

In some embodiments, the SPO detector 146, the program controller 148, or the program controller 158 may apply one pulse of the detection program DP to the plurality of monitoring cells MTC so as to detect whether an SPO occurs in the plurality of word lines WL0 to WLn−1 connected to the plurality of data cells DC. In contrast, when a first program which is applied to the plurality of data cells DC of the nonvolatile memory device 150 is performed, the number of times of a pulse applied to the plurality of data cells DC in the first program may be different from the number of times of the pulse applied to the plurality of monitoring cells MTC during the detection program DP. For example, when the pulse of the first program is applied to the plurality of data cells DC in advance, the pulse of the first program of which magnitude gradually increases is applied to the plurality of data cells DC multiple times. However, in one embodiment, the SPO detector 146, the program controller 148, or the program controller 158 may apply the pulse of the detection program DP to the plurality of monitoring cells MTC only once.

In one embodiment, the plurality of monitoring cells MTC of the nonvolatile memory device 150 do not serve as storing means to perform a normal read operation with an external device (e.g., the controller 130 or the host 102).

Consequently, since the pulse of the detection program DP is short, an overall program time of the nonvolatile memory device 150 may not be affected. Further, when the plurality of monitoring cells MTC are read later using a detection voltage DV of a predetermined voltage level, it is possible to determine whether an SPO occurs in a corresponding word line connected to the plurality of monitoring cells MTC. For example, it is possible to determine whether the plurality of data cells DC are programmed normally without an SPO. Hereinafter, a detailed detection method will be described with reference to flowcharts.

Figure 4:
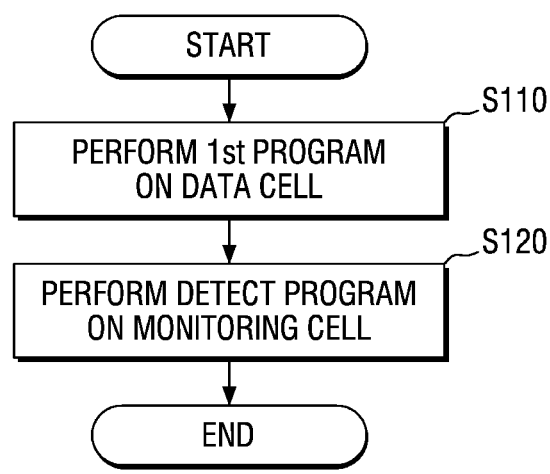
FIG. 4 is a flowchart illustrating a program method of a nonvolatile memory device according to some embodiments of the present disclosure.
Figure 5:
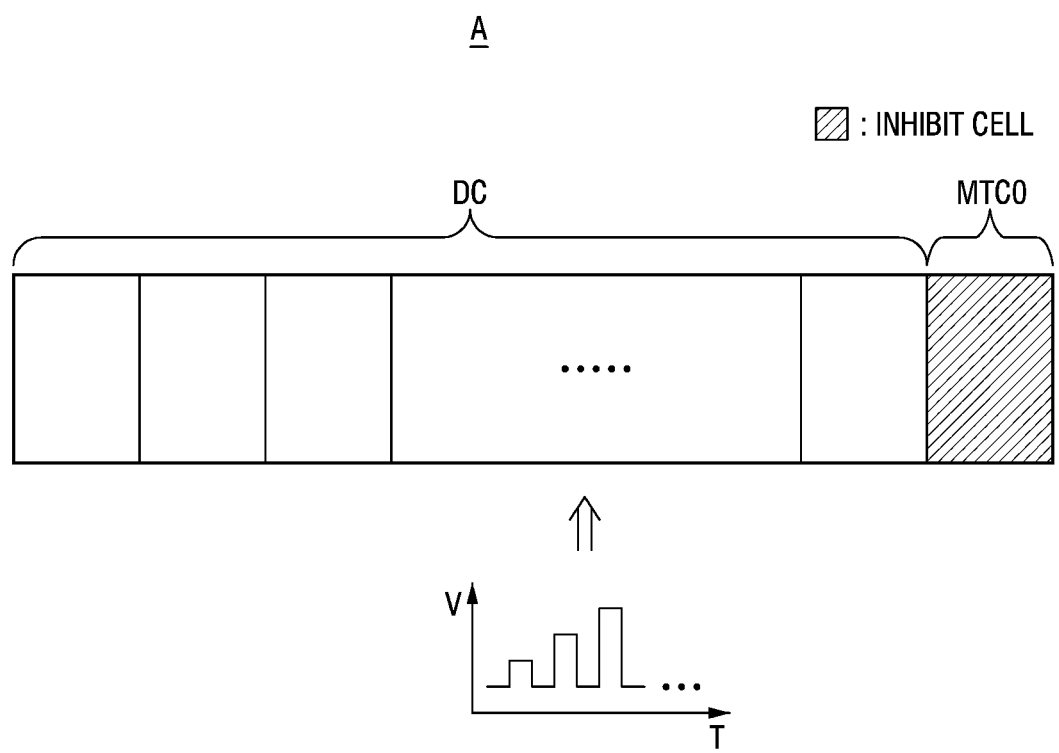
FIGS. 5 and 6 are exemplary diagrams for describing FIG. 4 according to some embodiments of the present disclosure.
Figure 6:
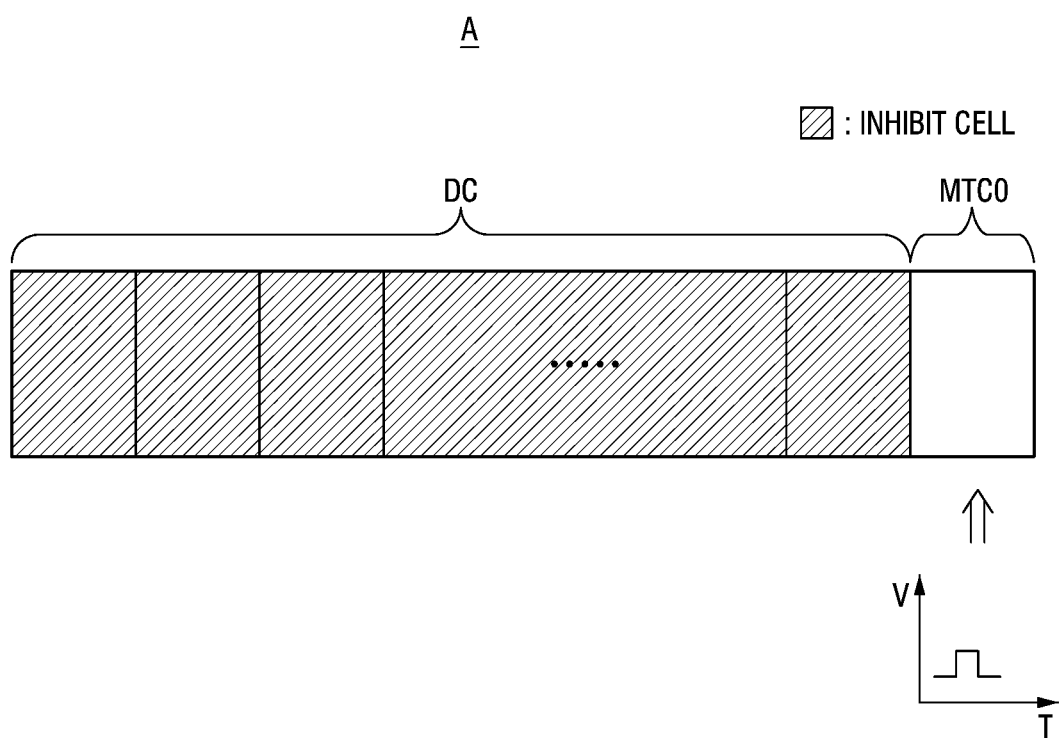

FIG. 4 is a flowchart illustrating a program method of a nonvolatile memory device according to some embodiments of the present disclosure. FIGS. 5 and 6 are exemplary diagrams for describing FIG. 4 according to some embodiments of the present disclosure.

Referring to FIG. 4 first, a first program is performed on a plurality of data cells DC of a nonvolatile memory device according to some embodiments (S110). Specifically, in a state in which a plurality of monitoring cells MTC are in an inhibited state, the first program is performed on the plurality of data cells DC. Hereinafter, a description will be made in more detail with reference to FIG. 5.

FIG. 5 is a conceptual block diagram of region A of FIG. 2A or 2B. In some examples, a plurality of data cells DC and a first monitoring cell MTC0 may be present in the region A. Each data cell of the plurality of data cells DC may store one-bit data. The first monitoring cell MTC0 may share a first word line WL0 with the plurality of data cells DC. In this case, the number of the first monitoring cell MTC0 is one, and the number thereof is not limited to FIG. 2A or 2B.

Inhibiting the first monitoring cell MTC0 means that a predetermined voltage is applied to the first word line WL0 and a bit line (e.g., BLm−1) which are connected to the first monitoring cell MTC0, and, even when one-bit data is programmed to the plurality of data cells DC, the one-bit data is prevented from being programmed to the first monitoring cell MTC0. Accordingly, when one-bit data is programmed to the plurality of data cells DC in a state in which the first monitoring cell MTC0 is inhibited, the one-bit data may be programmed to the plurality of data cells DC but may not be programmed to the first monitoring cell MTC0.

For example, it is assumed that three data cells DC and one monitoring cell MTC share the first word line WL0. Further, it is assumed that "110" is stored in the three data cells DC, for example, "1" is stored in a first data cell DC, "1" is stored in a second data cell DC, and "0" is stored in a third data cell DC, and "1" is stored in the one monitoring cell MTC. In this case, when "0" is programmed to all the three data cells DC in a state in which the one monitoring cell MTC is inhibited (specifically, when "0" is programmed to data in the first and second data cells among the three data cells DC), "000" may be stored in the three data cells DC. However, since the one monitoring cell MTC is inhibited while "0" is programmed to the three data cells DC, "1" may be still stored in the one monitoring cell MTC.

In this case, for example, an incremental step pulse program (ISPP) may be used to perform the first program on the plurality of data cells DC. That is, as shown in FIG. 5, the pulse of the first program, of which magnitude gradually increases, is applied to the plurality of data cells DC multiple times such that one-bit data may be programmed to the plurality of data cells DC by applying the pulse of the first program to the plurality of data cells DC. Specifically, the pulse of the first program is applied to a word line connected to the plurality of data cells DC during the first program.

Referring again to FIG. 4, an SPO detector, the program controller 148, or the program controller 158 may perform a detection program DP on a plurality of monitoring cells (S120). Specifically, in a state in which each data cell of the plurality of data cells DC is inhibited, a detection program different from the first program is performed on the plurality of monitoring cells. Hereinafter, a detailed description will be made with reference to FIG. 6.

FIG. 6 is also a conceptual block diagram of region A of FIG. 2A or 2B. In some examples, a plurality of data cells DC and a first monitoring cell MTC0 may be present in the region A.

Referring to FIG. 6, in states in which the plurality of data cells DC are inhibited, a detection program is performed on the first monitoring cell MTC0. Here, a difference between the performing of the detection program on the first monitoring cell MTC0 and the performing of the first program on the plurality of data cells DC may be the number of times of a pulse applied to the first monitoring cell MTC0 and the plurality of data cells DC. For example, as described above, when the first program is performed on the plurality of data cells DC, the pulse of the first program of which magnitude gradually increases is applied to the plurality of data cells DC multiple times, but, when the detection program is performed on the first monitoring cell MTC0, a pulse of the detection program may be applied to the first monitoring cell MTC0 only once.

According to the above disclosed embodiments, when the SPO detector performs the detection program on the nonvolatile memory device according to some embodiments and then reads the first monitoring cell MTC0 using a detection voltage DV of a predetermined voltage level, it is possible to determine whether an SPO occurs in the first word line WL0 connected to the plurality of data cells DC while the first program is performed on the plurality of data cells DC. For example, it is possible to determine whether the plurality of data cells DC are programmed without an SPO.

If an SPO occurs while the plurality of data cells DC are programmed, the detection program DP may not be performed on the first monitoring cell MTC0 which is programmed after the plurality of data cells DC are programmed. Accordingly, when the first monitoring cell MTC0 is read using the detection voltage DV, it may obtain a result in which the first monitoring cell MTC0 is not programmed (e.g., remaining erase state). However, if the SPO does not occur while the plurality of data cells DC are programmed, the detection program DP may be performed on the first monitoring cell MTC0 which is programmed after the plurality of data cells DC are programmed. Accordingly, in this case, when the first monitoring cell MTC0 is read using the detection voltage DV, it may obtain a result in which the detection program DP is performed on the first monitoring cell MTC0.

In summary, after the above-described program operations (e.g., the first program and the detection program) are completed, when, as the reading result of the first monitoring cell MTC0 using the detection voltage DV, the first monitoring cell MTC0 is programmed, the SPO is determined as not occurring in the first word line WL0 connected to the plurality of data cells DC. Therefore, it may be determined that data is programmed to the plurality of data cells DC sharing the first word line WL0 with the first monitoring cell MTC0.

However, as the reading result of the first monitoring cell MTC0 using the detection voltage DV, when the first monitoring cell MTC0 is not programmed, it is possible to detect that the SPO occurs in the first word line WL0 which is shared by the first monitoring cell MTC0 and the plurality of data cells DC. Accordingly, in this case, additional measures (e.g., data recovery or data removal) may be required with respect to data of the plurality of data cells DC sharing the first word line WL0 with the first monitoring cell MTC0.

Meanwhile, in a nonvolatile memory device according to some embodiments, when the first program is performed on a word line connected to a plurality of data cells DC, different magnitude pulses of the first program are applied to the word line connected to the plurality of data cells DC multiple times such that the first program is performed on the plurality of data cells DC. However, when the detection program is performed on the word line connected to a plurality of monitoring cells MTC and the plurality of data cells DC, the pulse of the detection program is applied to the word line connected to the plurality of monitoring cells MTC only once such that the detection program may be performed on the plurality of monitoring cells MTC. For example, barely any additional time may be elapsed in performing the detection program on the plurality of monitoring cells MTC. Accordingly, although the detection program is additionally performed on the plurality of monitoring cells MTC, an overall program time (e.g., tPROG) may not be affected in the process of the program method of the nonvolatile memory device according to some embodiments, and overall performance of the nonvolatile memory device according to some embodiments may not be significantly affected. For example, the SPO detector is capable of detecting whether an SPO occurs while data is programmed to the plurality of data cells DC while minimizing an influence on the performance of the nonvolatile memory device according to some embodiments.

Figure 7:
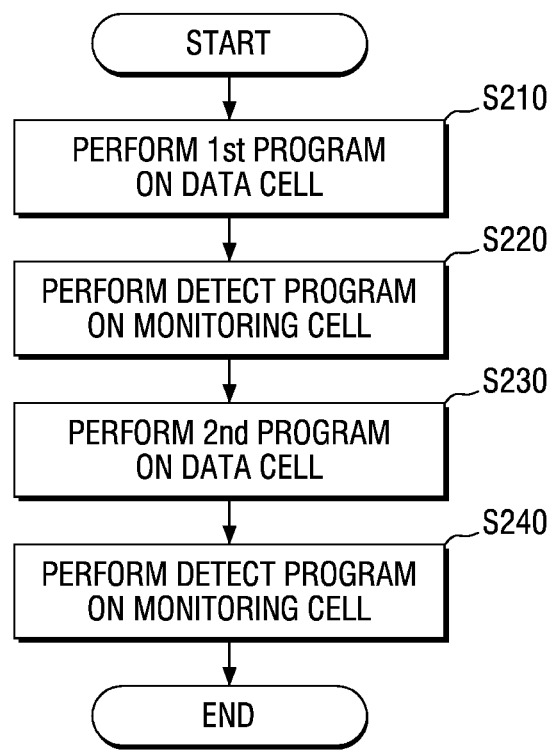
FIG. 7 is a flowchart illustrating a program method of a nonvolatile memory device according to some embodiments of the present disclosure.
Figure 8:
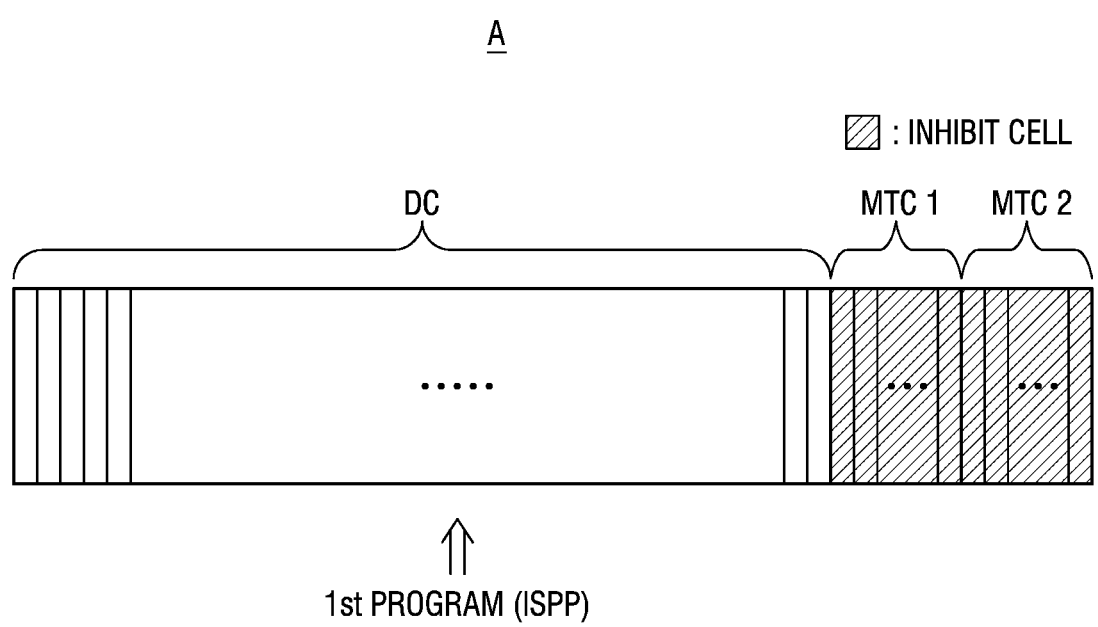
FIGS. 8 to 12 are exemplary diagrams for describing FIG. 7 according to some embodiments of the present disclosure.

FIG. 7 is a flowchart illustrating a program method of a nonvolatile memory device according to some embodiments of the present disclosure. FIGS. 8 to 12 are exemplary diagrams for describing FIG. 7 according to some embodiments of the present disclosure.

Referring to FIG. 7 first, a first program is performed on a plurality of data cells DC of the nonvolatile memory device according to some embodiments (S210).

Here, a basic structure of a memory cell array of the nonvolatile memory device according to some embodiments may be the same as that of FIG. 2A or 2B. For example, in FIGS. 7 to 12, it is assumed that each cell of the plurality of data cells DC and a plurality of monitoring cells MTC of the nonvolatile memory device according to some embodiments of the present disclosure may store 2-bit data. For example, the 2-bit data may include a first bit data which is programmed by the first program and a second bit data which is programmed by a second program. For example, the first bit data may be least significant bit (LSB) data, and the second bit data may be most significant bit (MSB) data.

Further, in FIGS. 4 to 6, the example in which the one monitoring cell MTC0 sharing the word line with the plurality of data cells DC is present has been described. In example embodiments, referring to FIGS. 8 to 12, an example in which a plurality of first monitoring cells MTC1 and a plurality of second monitoring cells MTC2 are present will be described. In some examples, the number of cells of the first and second monitoring cells MTC1 and MTC2 is 2K. The 2K monitoring cells MTC1 and MTC2 sharing a word line (e.g., WL0) with the plurality of data cells DC may be present (here, K is a natural number). An SPO detector may define K monitoring cells MTC1 among the 2K monitoring cells MTC1 and MTC2 as cells which detect whether an SPO occurs while the LSB data is programmed to the plurality of data cells DC and define the remaining K monitoring cells MTC2 as cells which detect whether an SPO occurs while the MSB data is programmed to the plurality of data cells DC.

Referring again to FIGS. 7 and 8, the first program is performed on the plurality of data cells DC (S210). Specifically, in a state in which the 2K monitoring cells MTC1 and MTC2 are inhibited, the first program may be performed on the plurality of data cells DC. In this case, for example, an incremental step pulse program (ISPP) may be used to perform the first program on the plurality of data cells DC. The ISPP may be performed by the program controller 148 or the program controller 158.

Figure 9:
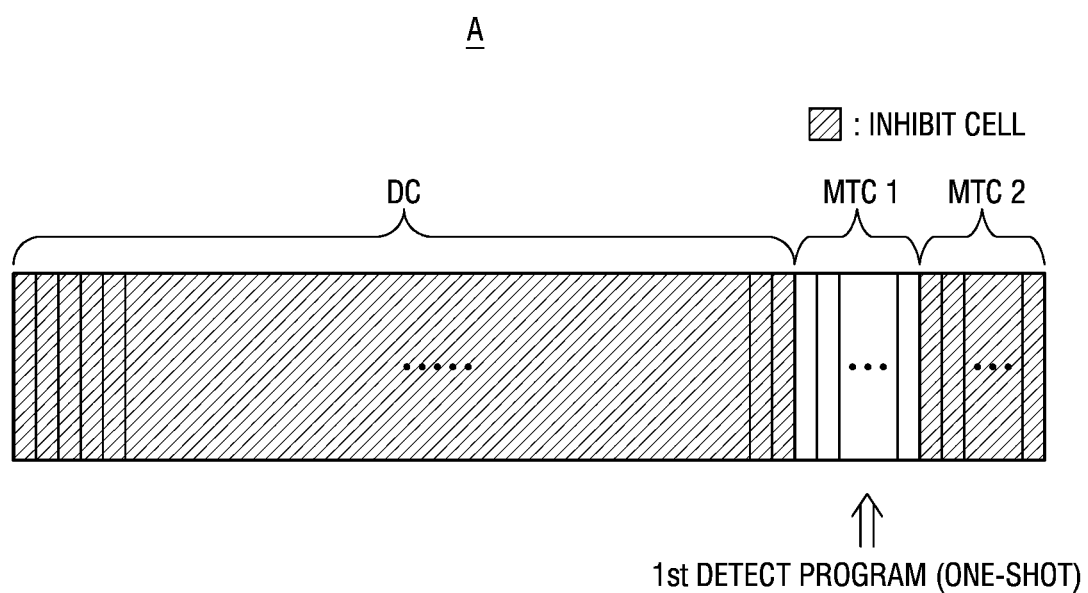

Next, referring to FIGS. 7 and 9, the SPO detector, the program controller 148, or the program controller 158 may perform a detection program to the K monitoring cells MTC1 (S220). Specifically, in a state in which the plurality of data cells DC and the remaining K monitoring cells MTC2, which are not yet programmed with a detection program, are inhibited, the detection program may be performed on the K monitoring cells MTC1. For example, while the detection program is performed on the K monitoring cells MTC1, the plurality of data cells DC programmed with the first program and the remaining K monitoring cells MTC2 may be maintained in the inhibited state.

Here, the fact that the detection program is performed on the K monitoring cells MTC1 may be such that, as described above, the detection program is performed on the K monitoring cells MTC1 once using a single program pulse.

Figure 10:
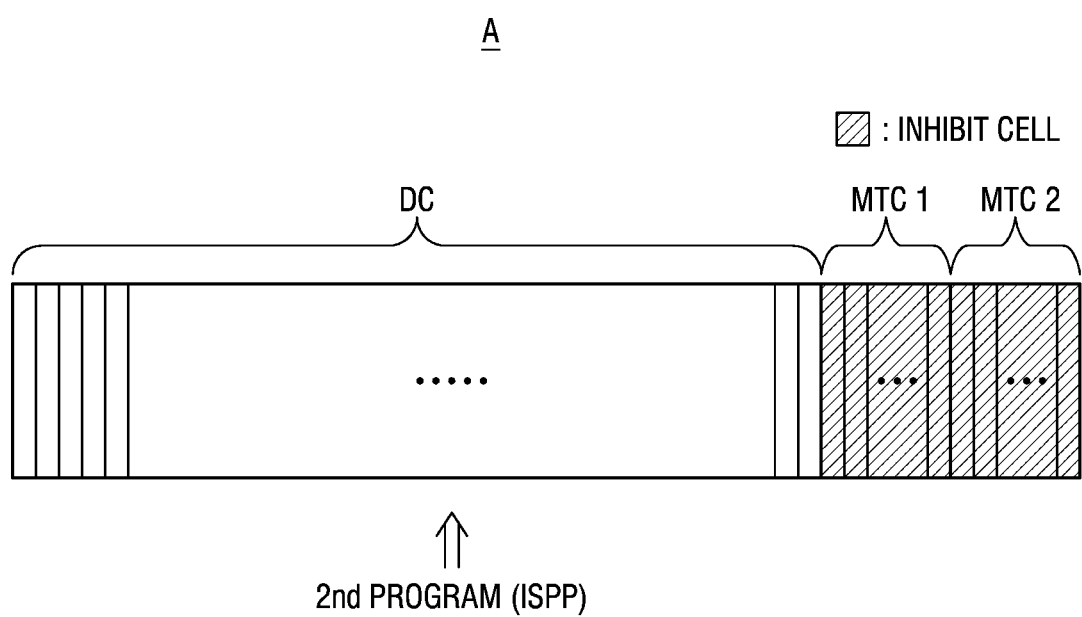

Next, referring to FIGS. 7 and 10, a second program is performed on the plurality of data cells DC (S230). Specifically, in a state in which the 2K monitoring cells MTC1 and MTC2 are inhibited, the second program may be performed on the plurality of data cells DC. Similarly in this case, for example, an ISPP may be used to perform the second program to the plurality of data cells DC.

Figure 11:
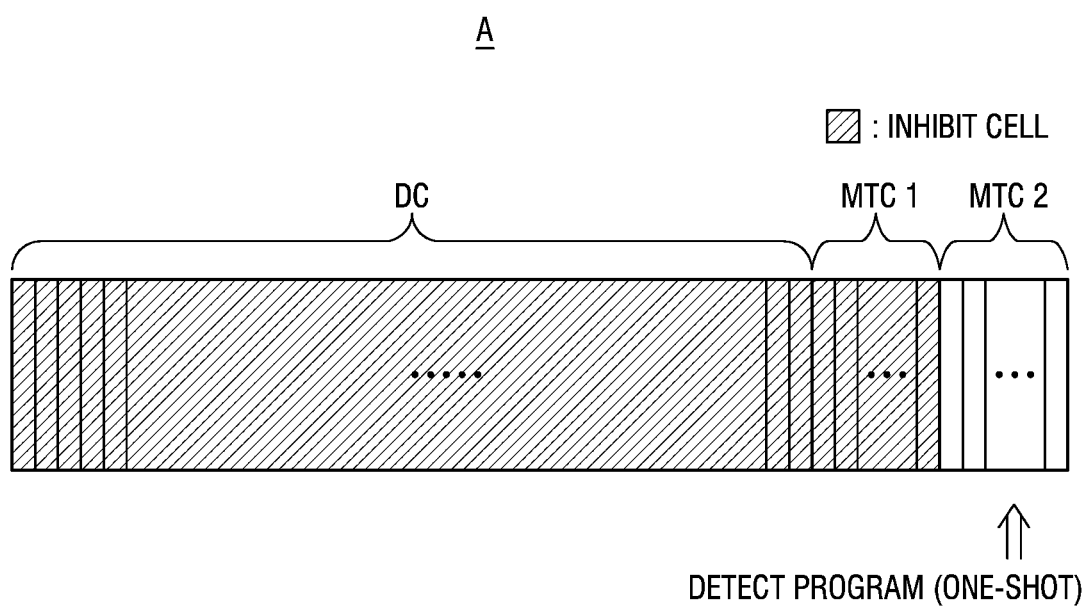

Next, referring to FIGS. 7 and 11, the detection program is performed on the remaining K monitoring cells MTC2 (S240). Specifically, in a state in which the plurality of data cells DC and the K monitoring cells MTC1, which are already programmed with the detection program, are inhibited, the detection program is applied to the remaining K monitoring cells MTC2. For example, while the detection program is performed on the remaining K monitoring cells MTC2, the plurality of data cells DC programmed by the second program and the K monitoring cells MTC1 programmed by the detection program may be maintained in the inhibited state.

Here, the fact that the SPO detector performs the detection program on the remaining K monitoring cells MTC2 may also be such that a single program pulse is applied to the remaining K monitoring cells MTC2 once.

According to the above disclosed embodiments, when the nonvolatile memory device according to some embodiments is programmed and then reads the plurality of first and second monitoring cells MTC1 and MTC1 using a detection voltage of a predetermined voltage level, it is possible to determine whether an SPO occurs in a word line shared with the plurality of data cells DC.

In this case, after the described-above first, second, and detection program operations are completed, the K monitoring cells MTC1 are read first using the detection voltage. Here, a voltage level of the detection voltage may be determined in consideration of a disturbance characteristic of the monitoring cells MTC1. Hereinafter, a description will be made in detail with reference to FIG. 12.

Figure 12:
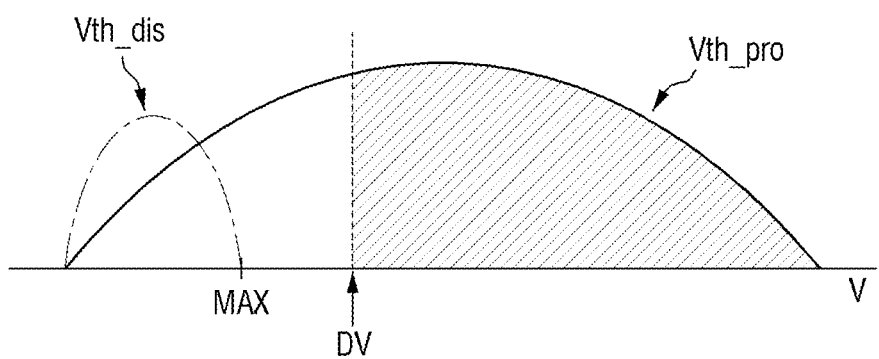

Referring to FIG. 12, the first curve Vth_dis is a curve showing a dispersion of a threshold voltage which is changeable due to self-disturbance of the K monitoring cells MTC1 in a state in which the detection program is not performed on the K monitoring cells MTC1. Further, the second curve Vth_pro is a curve showing a dispersion of the threshold voltage after a program pulse of the detection program is applied to the K monitoring cells MTC1 once and thus the detection program is performed on the K monitoring cells MTC1. In the program method of the nonvolatile memory device according to some embodiments, since the program pulse of the detection program is applied to the K monitoring cells MTC1 once, as shown in the drawing, the threshold voltage dispersion curve Vth_pro by the detection program may be formed to be widely spread.

In this case, a detection voltage DV for reading the K monitoring cells MTC1 may be greater than the maximum value MAX of the threshold voltage which is changeable due to the self-disturbance of the K monitoring cells MTC1. Further, when at least one of the K monitoring cells MTC1 is detected as being programmed (i.e., when a slashed region of FIG. 12 is present), it is possible to detect that the SPO does not occur in the word line which is shared by the K monitoring cells MTC1 and the plurality of data cells DC. For example, when an SPO should be determined as not occurring on at least one of the K monitoring cells MTC1, it is possible to detect a result in which the SPO occurs in a corresponding word line. For example, when the SPO is determined as occurring on at least one of the K monitoring cells MTC1, the SPO detector may determine that the SPO is detected from the corresponding word line. This process may be applied to the above-described single monitoring cell and may be equally applied to the remaining K monitoring cells MTC2 in the present description.

In the nonvolatile memory device according to some embodiments, whether an SPO occurs in the word line, which is shared by the 2K monitoring cells MTC1 and MTC2 and the plurality of data cells DC, may be determined as follows.

First, after the above-described operations of the first program, the second program, and the detection program are completed, the K monitoring cells MTC1 are read using the detection voltage DV. As a result, when at least one of the K monitoring cells MTC1 is not programmed by the detection program, it may be determined that an SPO is detected from a corresponding word line. This may be applied to a process of detecting an SPO detection through the remaining K monitoring cells MTC2 and may also be applied to a single monitoring cell.

Figure 13:
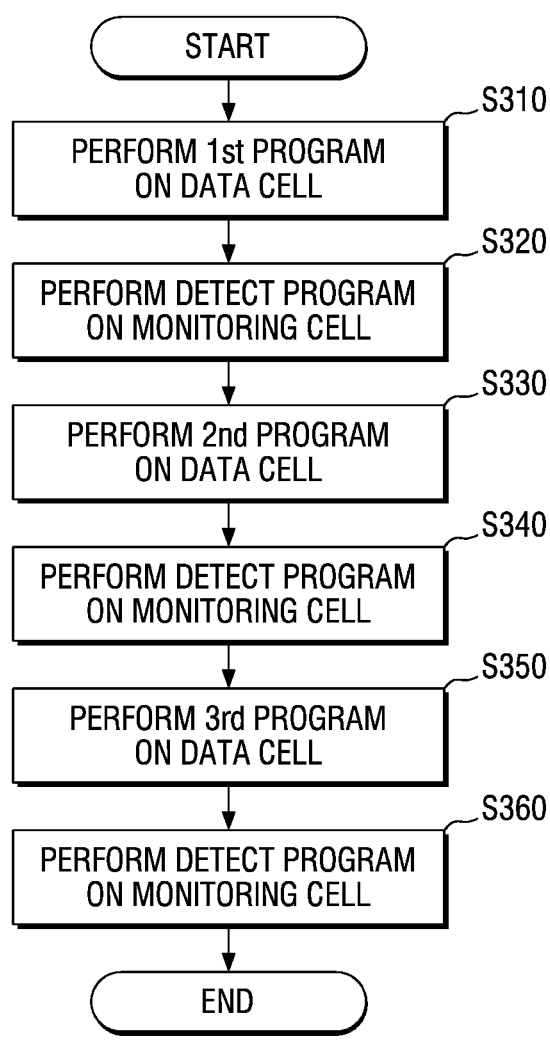
FIG. 13 is a flowchart illustrating a program method of a nonvolatile memory device according to some embodiments of the present disclosure.

FIG. 13 is a flowchart illustrating a program method of a nonvolatile memory device according to some embodiments of the present disclosure. FIGS. 14 to 19 are exemplary diagrams for describing FIG. 13 according to some embodiments of the present disclosure.

Here, a basic structure of a memory cell array of the nonvolatile memory device according to some embodiments may also be the same as that of FIG. 2A or 2B. For example, it may be assumed that each cell of a plurality of data cells DC and a plurality of third, fourth, and fifth monitoring cells MTC3, MTC4, and MTC5 of the nonvolatile memory device according to some embodiments may store three-bit data. Here, the three-bit data may include a first bit data which is programmed by a first program, a second bit data which is programmed by a second program, and a third bit data which is programmed by a third program. For example, the first bit data may be LSB data, the second bit data may be central significant bit (CSB) data, and the third bit data may be MSB data.

In some examples, the number of cells of the third, fourth, and fifth monitoring cells MTC3, MTC4, and MTC5 is 3K. In FIGS. 13 to 19, an example in which 3K monitoring cells MTC3, MTC4, and MTC5 (here, K is a natural number) sharing a word line (e.g., WL0) with the plurality of data cells DC are present will be described. Here, an SPO detector may define K monitoring cells MTC3 as cells which detect whether an SPO occurs in the word line while the first program is performed on the plurality of data cells DC, define other K monitoring cells MTC4 as cells which detect whether the SPO occurs in the word line while the second program is performed on the plurality of data cells DC, and define the remaining K monitoring cells MTC5 as cells which detect whether the SPO occurs in the word line while the third program is performed on the plurality of data cells DC.

Figure 14:
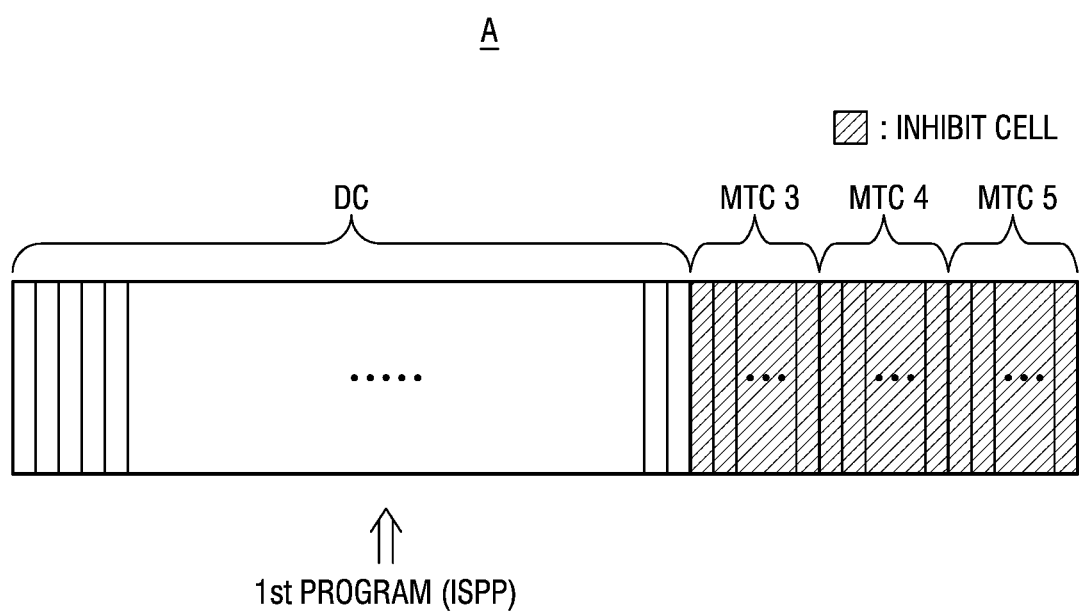
FIGS. 14 to 19 are exemplary diagrams for describing FIG. 13 according to some embodiments of the present disclosure.

Referring to FIGS. 13 and 14, the first program is performed on the plurality of data cells DC (S310). Specifically, in a state in which the 3K monitoring cells MTC3, MTC4, and MTC5 are inhibited, the first program is applied to the plurality of data cells DC. In this case, for example, an ISPP may be used to perform the first program on the plurality of data cells DC.

Figure 15:
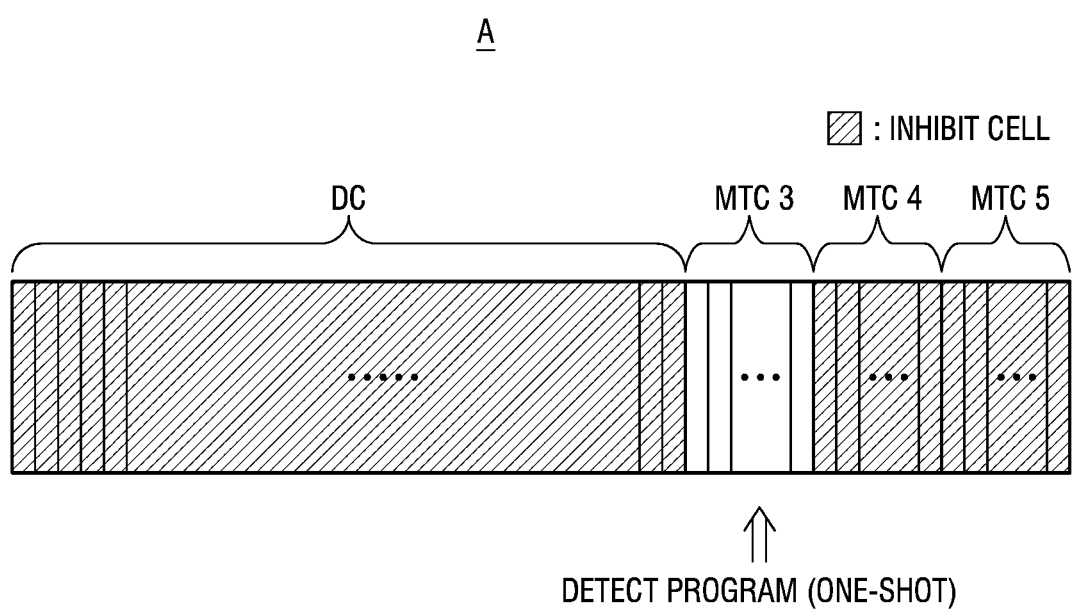

Next, referring to FIGS. 13 and 15, a detection program is programmed to the K monitoring cells MTC3 (S320). Specifically, in a state in which the plurality of data cells DC and the remaining 2K monitoring cells MTC4 and MTC5, which are not yet programmed with the detection program, are inhibited, the detection program is programmed to the K monitoring cells MTC3. For example, while the detection program is performed on the K monitoring cells MTC3, the plurality of data cells DC programmed by the first program and the remaining 2K monitoring cells MTC4 and MTC5 may each be maintained in an inhibited state. Here, as described above, the fact that the detection program is performed on the K monitoring cells MTC3 may be such that the detection program is performed on the K monitoring cells MTC3 once using a single program pulse.

Figure 16:
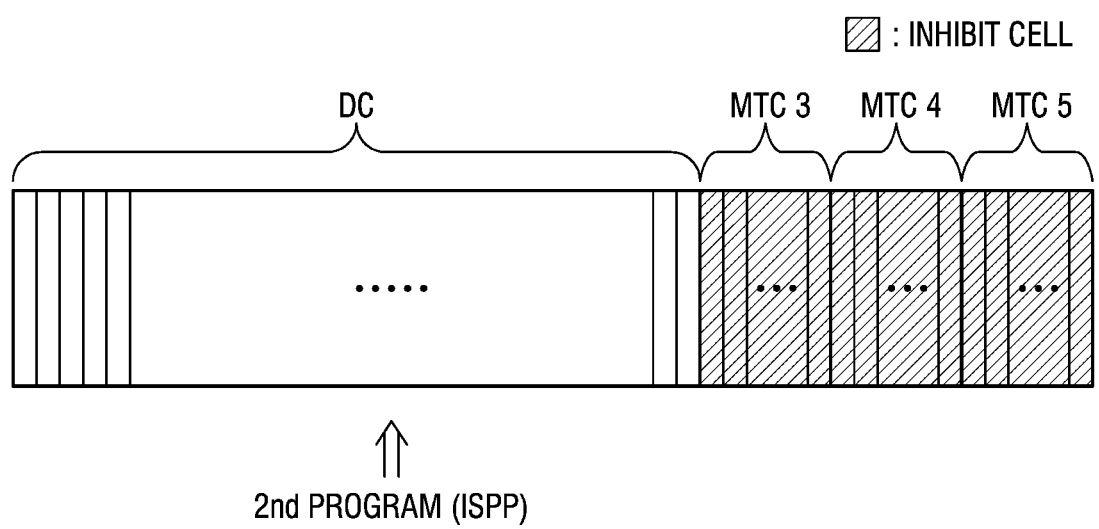

Next, referring to FIGS. 13 and 16, a second program is performed on the plurality of data cells DC (S330). Specifically, in a state in which the 3K monitoring cells MTC3, MTC4, and MTC5 are inhibited, the second program is performed on the plurality of data cells DC. In this case, for example, an ISPP may be used to perform the second program on the plurality of data cells DC.

Figure 17:
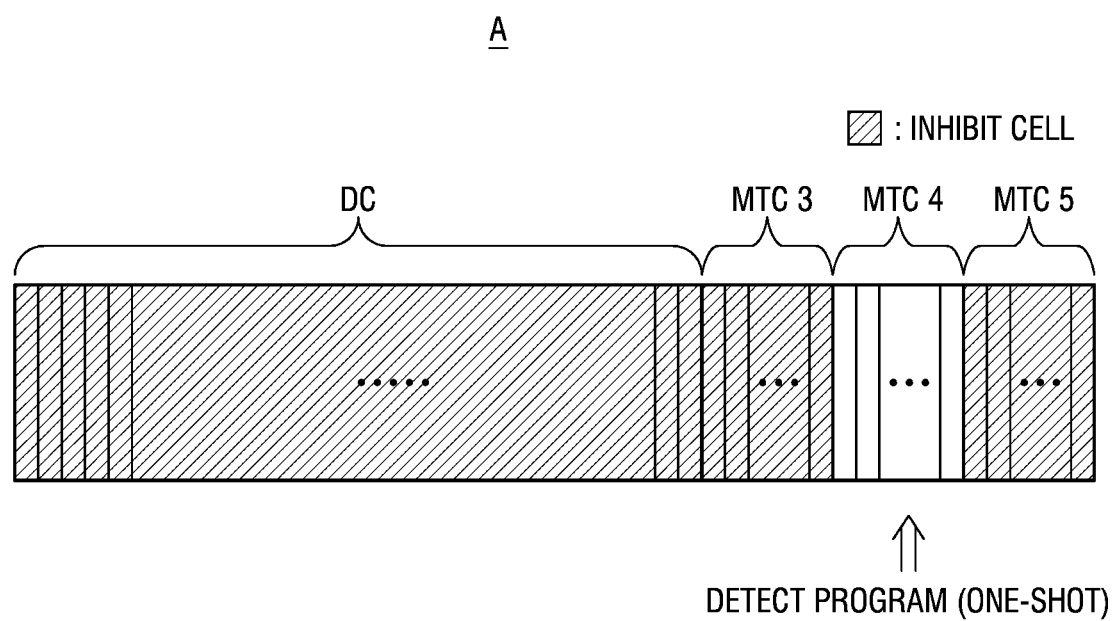

Next, referring to FIGS. 13 and 17, an SPO detector performs the detection program to the K monitoring cells MTC4 (S340). Specifically, in a state in which the plurality of data cells DC and the 2K monitoring cells MTC3 and MTC5 are inhibited, the detection program is performed on the K monitoring cells MTC4. Here, as described above, the detection program being applied to the K monitoring cells MTC4 may be executed such that a single program pulse for performing the detection program is applied to the K monitoring cells MTC4 once.

Figure 18:
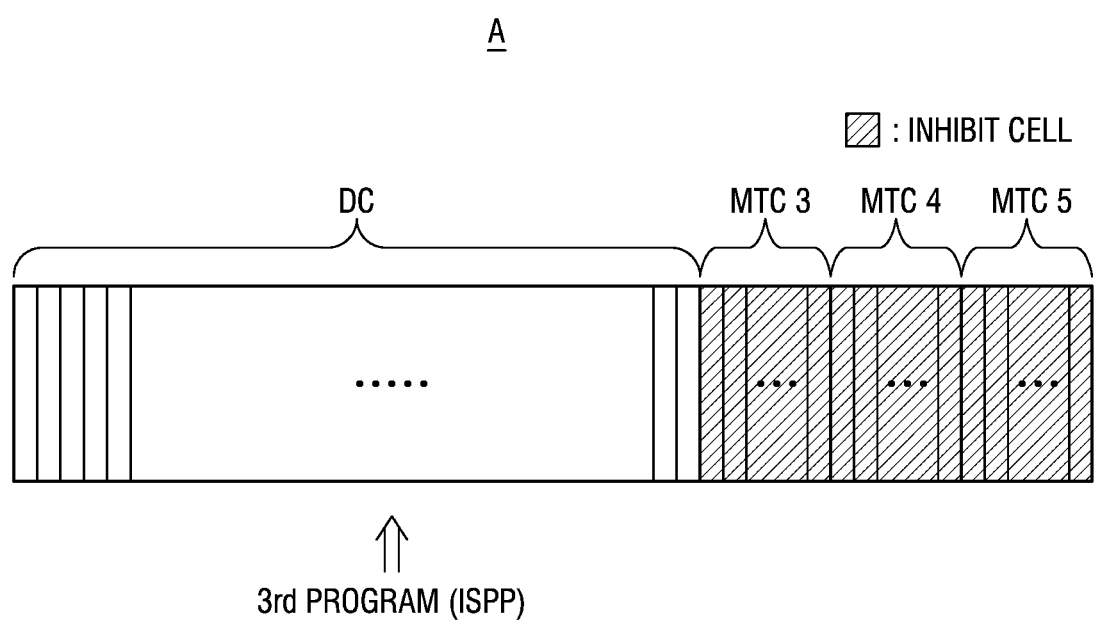

Next, referring to FIGS. 13 and 18, a third program is programmed to the plurality of data cells DC (S350). Specifically, in a state in which the 3K monitoring cells MTC3, MTC4, and MTC5 are inhibited, the third program is performed on the plurality of data cells DC. In this case, for example, an ISPP may be used to perform the third program on the plurality of data cells DC.

Figure 19:
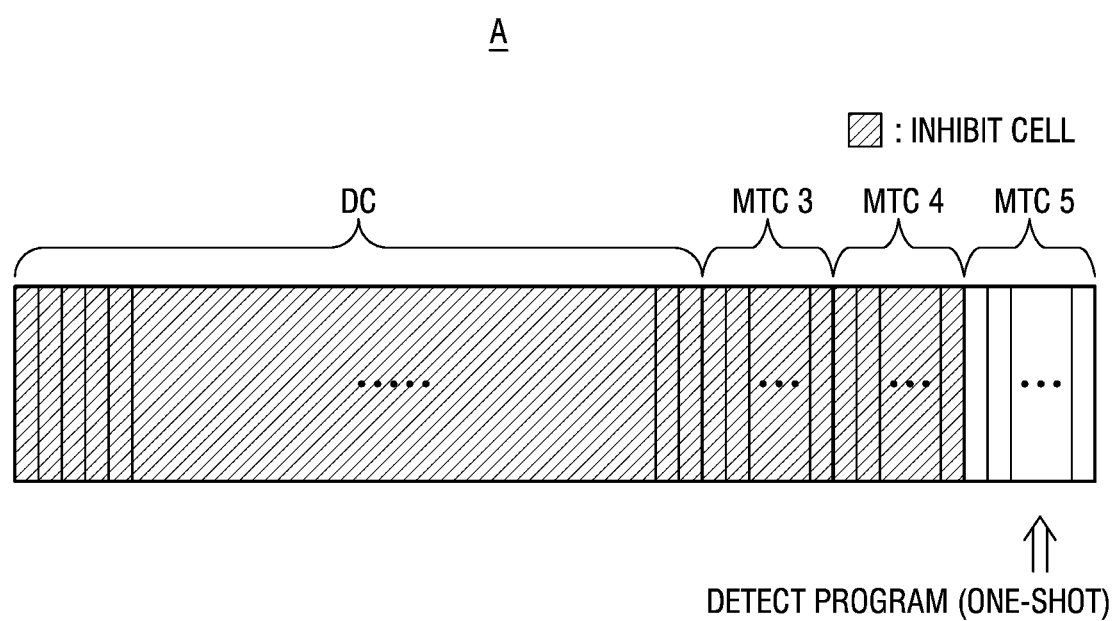

Next, referring to FIGS. 13 and 19, the SPO detector, the program controller 148, or the program controller 158 may perform the detection program to the K monitoring cells MTC5 (S360). Specifically, in a state in which the plurality of data cells DC and the 2K monitoring cells MTC3 and MTC4 are inhibited, the detection program is performed on the K monitoring cells MTC5. Here, as described above, the detection program being applied to the K monitoring cells MTC5 may be executed such that a single program pulse for performing the detection program is applied to the K monitoring cells MTC5 once.

According to the above disclosed embodiments, when the nonvolatile memory device is programmed and then the plurality of third to fifth monitoring cells MTC3, MTC4, and MTC5 are read using a detection voltage of a predetermined voltage level, it is possible to determine whether an SPO occurs in the word line shared with the plurality of data cells DC.

Although the plurality of data cells DC and the plurality of monitoring cells MTC can each store one-bit data, two-bit data, and three-bit data, the present disclosure is not limited thereto. Within the above-described technical idea of the present disclosure, data which can be stored in each cell of the plurality of data cells DC and the plurality of monitoring cells MTC can extend to N-bit data (here, N is a natural number).

Further, in the above-described embodiments, although the cases in which the number of the plurality of monitoring cells MTC is one, 2K, and 3K have been described, since the data which can be stored in each cell of the plurality of data cells DC and the plurality of monitoring cells MTC extends to the N-bit data, the number of the plurality of monitoring cells MTC can also extend to M (here, M=N*K, where K is a natural number).

While the inventive concept has been described with reference to exemplary embodiments thereof, it will be apparent to those of ordinary skill in the art that various changes and modifications may be made thereto without departing from the spirit and scope of the invention as set forth in the following claims.

What is claimed is:

1. A nonvolatile memory device comprising:
a memory cell array including a plurality of word lines having a first word line and a plurality of memory cells connected to the first word line, the plurality of memory cells including one or more monitoring cells and a plurality of data cells each data cell configured to store N-bit data, N being a natural number,
wherein the nonvolatile memory device is configured to perform a first program on the plurality of data cells and to perform a detection program different from the first program on the one or more monitoring cells,
wherein the detection program is performed after performing the first program,
wherein the nonvolatile memory device is configured to:
evaluate the plurality of data cells using a plurality of read voltages after performing the first program, and
evaluate the one or more monitoring cells using a detection voltage different from the plurality of read voltages after performing the detection program, and
wherein the nonvolatile memory device is connected to a controller including a sudden power off (SPO) detector configured to detect whether an SPO occurs while the first program is performed on the plurality of data cells by reading data from the one or more monitoring cells using the detection voltage.

2. The nonvolatile memory device of claim 1, wherein the SPO detector is further configured to apply a single program pulse to the first word line connected to the one or more monitoring cells once during the detection program.

3. The nonvolatile memory device of claim 1, wherein the nonvolatile memory device includes a program controller configured to apply a single program pulse to the first word line connected to the one or more monitoring cells once during the detection program.

4. The nonvolatile memory device of claim 3, wherein the first program is an incremental step pulse program (ISPP) which programs the N-bit data to the plurality of data cells.

5. The nonvolatile memory device of claim 3, wherein the detection voltage is greater than the maximum threshold voltage of the one or more monitoring cells due to a disturbance irrespective of the detection program.

6. The nonvolatile memory device of claim 5, wherein, when at least one of the one or more monitoring cells is in an erase state, the SPO detector determines that an SPO has occurred in the first word line.

7. The nonvolatile memory device of claim 1, wherein the plurality of memory cells further include additional monitoring cells, and wherein, when the N is 2 or greater than 2, the nonvolatile memory device is configured to further perform one or more additional first programs on the plurality of data cells to program the N-bit data and perform additional one or more detection programs on the additional monitoring cells.

8. The nonvolatile memory device of claim 1, wherein the nonvolatile memory device is configured such that the detection program is performed on the one or more monitoring cells when the plurality of data cells are inhibited.

9. A storage device comprising:
a nonvolatile memory including a plurality of word lines having a first word line and a plurality of memory cells connected to the first word line, the plurality of memory cells including a plurality of monitoring cells and a plurality of data cells each data cell configured to store N-bit data, N being a natural number; and
a controller configured to perform a first program on the plurality of data cells and to perform a detection program different from the first program on the plurality of monitoring cells,
wherein the controller includes a sudden power off (SPO) detector configured to detect whether an SPO occurs while the first program is performed on the plurality of data cells,
wherein the nonvolatile memory is configured to:
evaluate the plurality of data cells using a plurality of read voltages after performing the first program, and
evaluate the plurality of monitoring cells using a detection voltage different from the plurality of read voltages after performing the detection program,
wherein the nonvolatile memory includes a program controller configured to apply only one single program pulse to the first word line connected to the plurality of monitoring cells during the detection program, and
wherein the SPO detector is configured to detect whether the SPO occurs while the first program is performed on the plurality of data cells by reading data from the plurality of monitoring cells using the detection voltage.

10. The storage device of claim 9, wherein the detection voltage is greater than the maximum threshold voltage of the plurality of monitoring cells due to a disturbance irrelevant to the detection program.

11. The storage device of claim 10, wherein, when at least one of the plurality of monitoring cells is in an erase state, the SPO detector determines that an SPO has occurred in the first word line.

12. The storage device of claim 9, wherein the plurality of memory cells further include additional monitoring cells, and
wherein, when the N is 2 or greater than 2, the controller is configured to further perform one or more additional first programs on the plurality of data cells to program the N-bit data and perform additional one or more detection programs on the additional monitoring cells.

13. A nonvolatile memory device comprising:
a memory cell array including a plurality of word lines including a first word line and a plurality of first memory cells and a plurality of second memory cells both connected to the first word line,
wherein the nonvolatile memory device is configured to:
perform a first program on the plurality of first memory cells each cell of the plurality of first memory cells configured to store N-bit data, N being a natural number, and
perform a detection program different from the first program on the plurality of second memory cells as a plurality of monitoring cells,
wherein the nonvolatile memory device is configured to:
evaluate the plurality of first memory cells using a plurality of read voltages after performing the first program, and
evaluate the plurality of second memory cells using a detection voltage different from the plurality of read voltages after performing the detection program, and
wherein the nonvolatile memory device is connected to a controller including a sudden power off (SPO) detector configured to detect whether an SPO occurs while the first program is performed on the plurality of first memory cells by reading the plurality of second memory cells using the detection voltage.

14. The nonvolatile memory device of claim 13, wherein the nonvolatile memory device is configured to apply a single program pulse to the first word line connected to the plurality of second memory cells once during the detection program.

15. The nonvolatile memory device of claim 14, wherein the detection voltage is greater than the maximum threshold voltage of the plurality of second memory cells due to a disturbance irrelevant to the detection program.

16. The nonvolatile memory device of claim 15, wherein, when at least one of the plurality of second memory cells is in an erase state, the SPO detector determines that an SPO has occurred in the first word line.

\* \* \* \* \*